United States Patent
Su et al.

(10) Patent No.: US 7,857,636 B2
(45) Date of Patent: Dec. 28, 2010

(54) CABLE CONNECTOR ASSEMBLY WITH AN IMPROVED PRINTED CIRCUIT BOARD

(75) Inventors: Ping-Sheng Su, Tu-Cheng (TW); Feng-Jun Qi, Kunshan (CN); Jun Chen, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/635,715

(22) Filed: Dec. 11, 2009

(65) Prior Publication Data

US 2010/0151705 A1 Jun. 17, 2010

(30) Foreign Application Priority Data

Dec. 11, 2008 (CN) .......................... 2008 2 030331

(51) Int. Cl.
*H01R 12/00* (2006.01)
(52) U.S. Cl. .................................................... 439/76.1
(58) Field of Classification Search ............... 439/76.1, 439/607.57, 362, 67
See application file for complete search history.

(56) References Cited

U.S. PATENT DOCUMENTS

| | | | | |
|---|---|---|---|---|
| 5,306,160 A | * | 4/1994 | Roberts | 439/67 |
| 5,362,243 A | * | 11/1994 | Huss et al. | 439/76.1 |
| 5,797,771 A | * | 8/1998 | Garside | 439/607.46 |
| 5,920,459 A | * | 7/1999 | Weber et al. | 439/362 |
| 6,176,743 B1 | * | 1/2001 | Kuo | 439/75 |
| 6,343,957 B1 | * | 2/2002 | Kuo et al. | 439/76.1 |
| D535,623 S | | 1/2007 | Hung-Way | |
| 7,410,366 B2 | * | 8/2008 | Wu | 439/76.1 |
| 7,445,468 B2 | * | 11/2008 | Chen et al. | 439/76.1 |
| 7,497,738 B2 | * | 3/2009 | Kuo | 439/76.1 |
| 2008/0038941 A1 | * | 2/2008 | Bartholomew | 439/76.1 |
| 2009/0264011 A1 | * | 10/2009 | Wang | 439/507 |

\* cited by examiner

*Primary Examiner*—Briggitte R Hammond
(74) *Attorney, Agent, or Firm*—Wei Te Chung; Andrew C. Cheng; Ming Chieh Chang

(57) ABSTRACT

A cable connector assembly includes an insulative housing (1) having a plurality of contacts (2) received therein, a shielding (3) enclosing the insulative housing (1), a printed circuit board (4) connected with tail portions (21) of the contacts and a cable (5) connected with the printed circuit board. The printed circuit board (4) has a first printed circuit board (41) and a second printed circuit board (42) located below the first printed circuit board, the first and the second printed circuit boards are electrically connecting with each other by a flexible circuit (43).

19 Claims, 5 Drawing Sheets

CABLE CONNECTOR ASSEMBLY WITH AN IMPROVED PRINTED CIRCUIT BOARD

BACKGROUND OF THE INVENTION

1. Field of the Invention

The present invention generally relates to a cable connector assembly, and more particularly to a cable connector assembly used for video signal transmission.

2. Description of Related Art

Nowadays, cable connector assemblies are widely used for connecting two electronic devices with different interfaces, U.S. Pat. No. D535,623S issued to Huang on Jan. 23, 2007 discloses a cable connector assembly, the cable connector assembly comprises a Digital Visual Interface (DVI) connector on one end and a High Definition Multimedia Interface (HDMI) connector on the other end. Usually, the DVI connector comprises an insulative housing, a group of contacts received in the insulative housing, a printed circuit board connected with the contacts, and a cover enclosing the insulative housing. When the DVI cable connector connected with other connectors with one end to form an adapter, such as the Displayport connector, the printed circuit board of the DVI cable connector may be disposed with a plurality of electronic elements and a complex circuit to make the adapter work normally, one solution is that the printed circuit board required to be large enough to dispose the electronic elements, thus the dimension of the DVI cable connector will be larger. Another solution is that the printed circuit board displaced by a flexible printed circuit board, and the flexible printed circuit board can be accommodated in the cover, however the cost of the DVI cable connector will be increased.

Correspondingly, it is desired to have a cable connector assembly with improved shielding member to address the problems stated above.

BRIEF SUMMARY OF THE INVENTION

Accordingly, an object of the present invention is to provide a cable connector assembly having an improved printed circuit board for decreasing the dimension thereof.

In order to achieve the above-mentioned object, a cable connector assembly in accordance with the present invention comprises an insulative housing having a plurality of contacts received therein, a shielding enclosing the insulative housing, a printed circuit board connected with tail portions of the contacts and a cable connected with the printed circuit board. The printed circuit board has a first printed circuit board and a second printed circuit board located below the first printed circuit board, the first and the second printed circuit boards are electrically connecting with each other by a flexible circuit.

Other objects, advantages and novel features of the invention will become more apparent from the following detailed description of the present embodiment when taken in conjunction with the accompanying drawings.

DETAILED DESCRIPTION OF THE INVENTION

Figure 1:
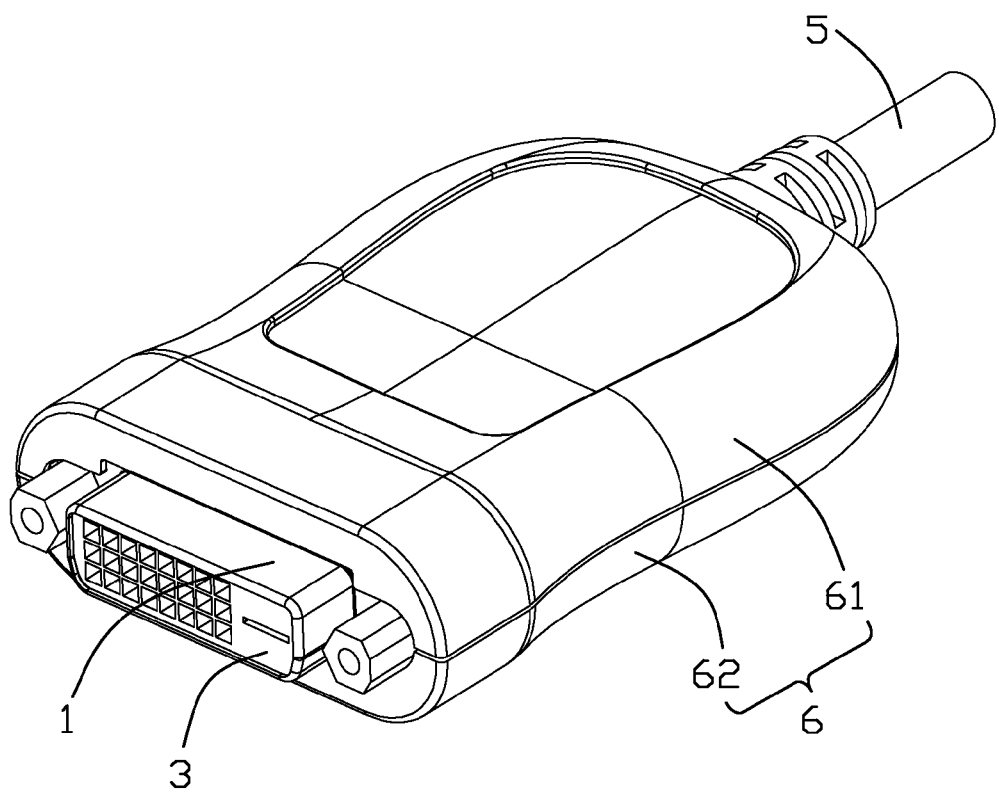
FIG. 1 is an assembled, perspective view of a cable connector assembly.

Reference will now be made to the drawing figures to describe the present invention in detail.

Figure 2:
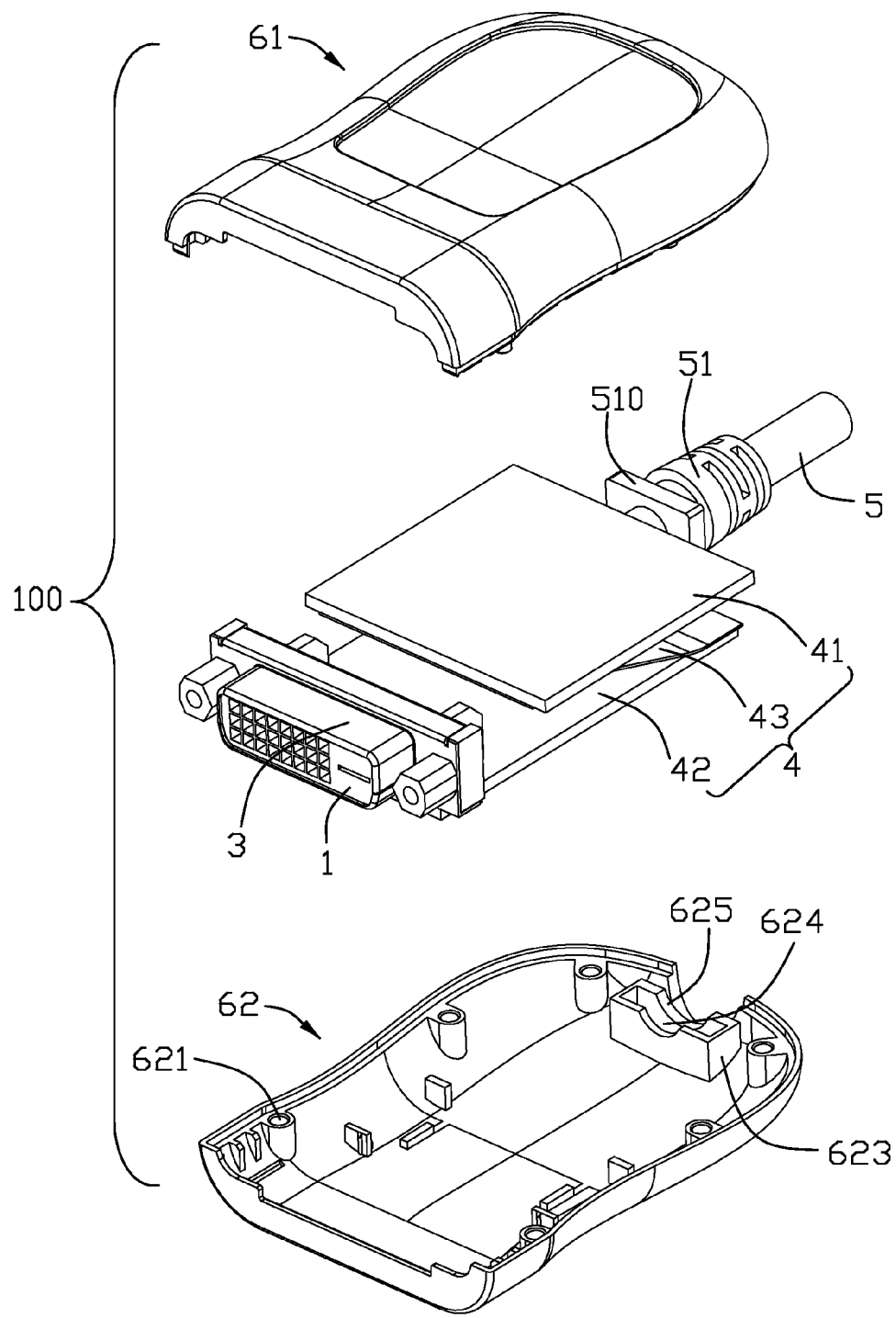
FIG. 2 is a partially exploded, perspective view of the cable connector assembly in accordance with the first embodiment of the present invention.
Figure 3:
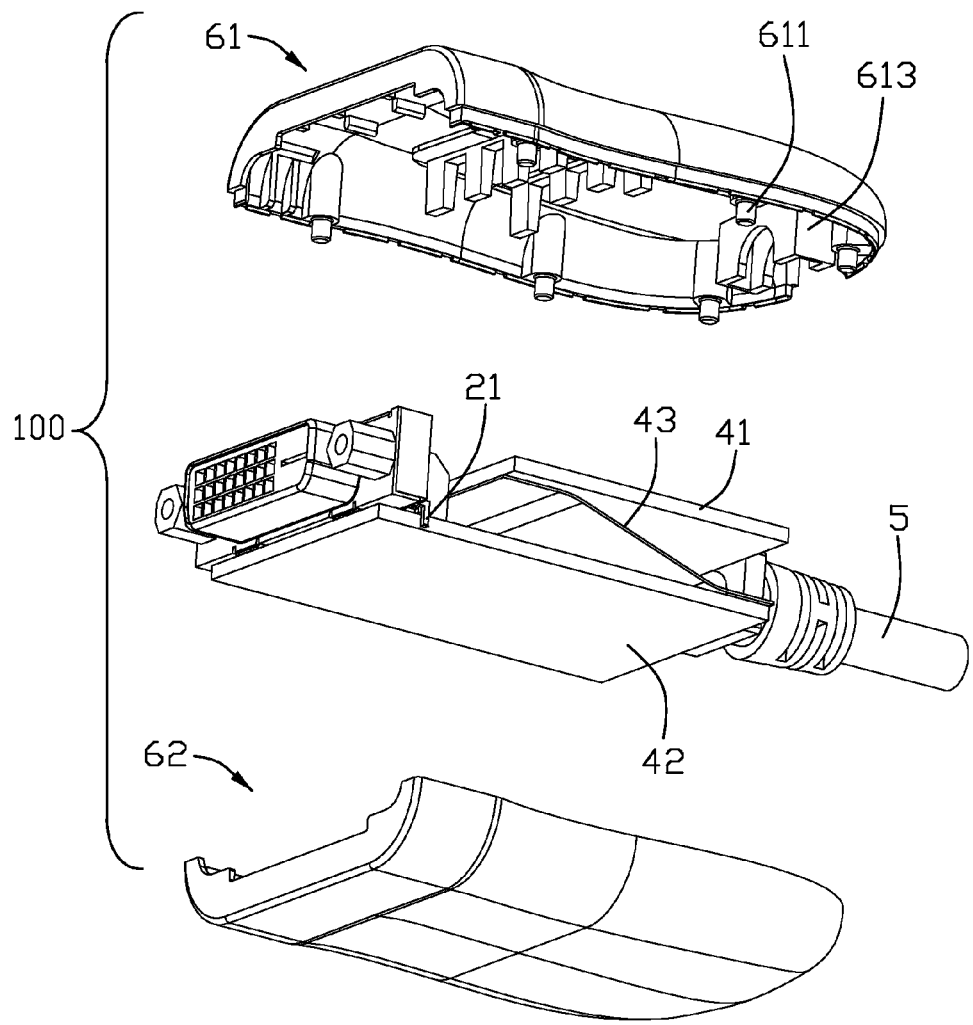
FIG. 3 is similar to FIG. 2, but viewed from another aspect.

Referring to FIGS. 1-3, a cable connector assembly 100 in accordance with the present invention comprises an insulative housing 1, a plurality of contacts 2 received in the insulative housing 1, a metallic shielding 3 enclosing a mating port of the insulative housing 1, a printed circuit board 4, a cable 5 and a cover 6. The cover 6 is made of insulative material, and comprises a top cover 61 and a bottom cover 62 assembled to each other along an up-to-down direction.

Figure 4:
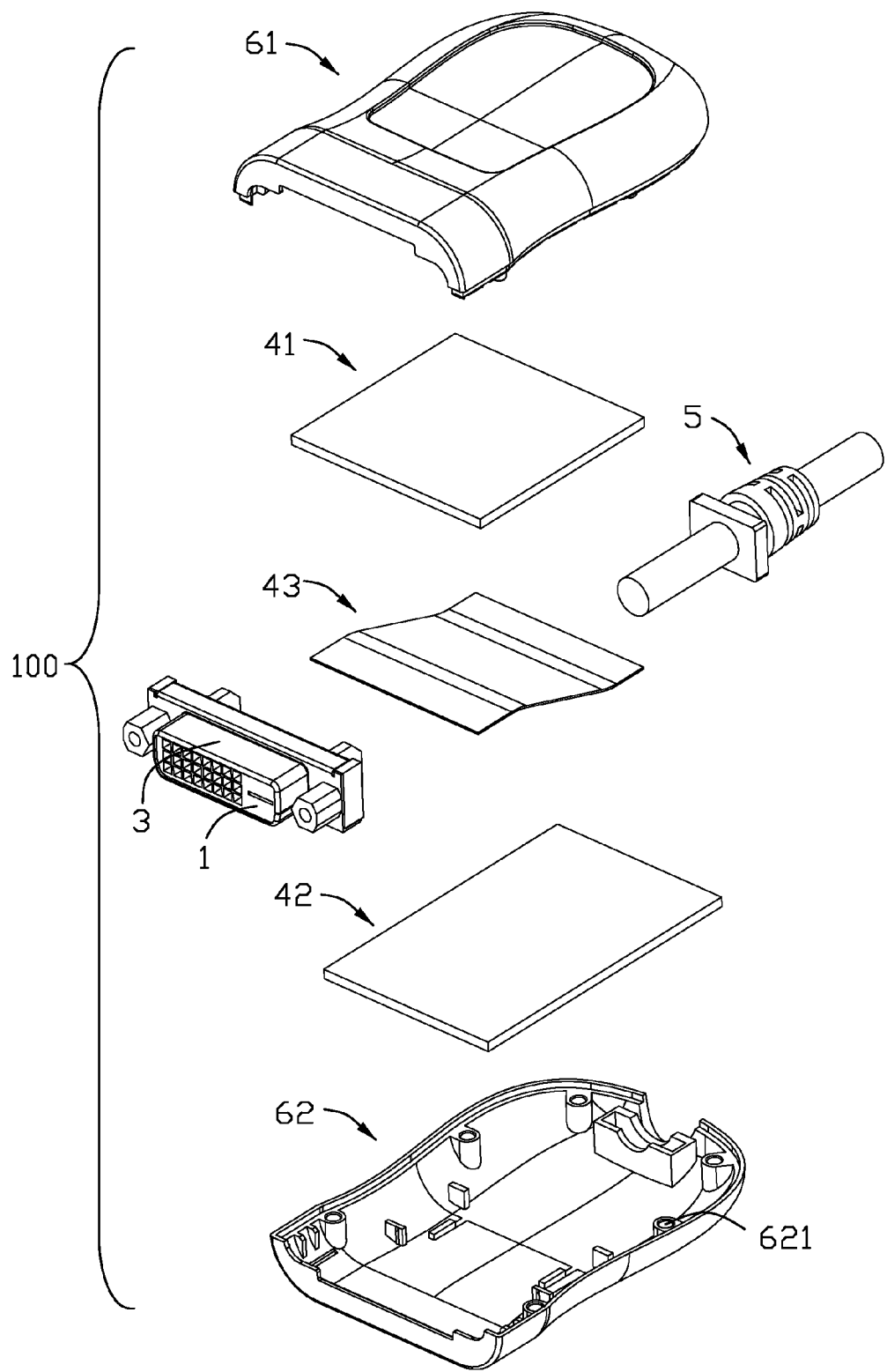
FIG. 4 is an exploded, perspective view of the cable connector assembly shown in FIG. 2.

Referring to FIGS. 2-4, the cable connector assembly 100 is compatible with Digital Visual Interface (DVI) transmitting protocol, the cable 5 is connecting with a Displayport connector (not shown) on an end opposite to the cable connector assembly 100. The contacts 2 are assembled in the insulative housing 1, and tail portions 21 of the contacts 2 are bent downwards and exposed out of a back end of the insulative housing 1.

In the first embodiment of the present invention, the printed circuit board 4 includes a first printed circuit board 41, a second printed circuit board 42 and a flexible circuit 43 connected the first printed circuit board 41 with a second printed circuit board 42. The flexible circuit 43 can be a flexible flat cable (FFC) or a flexible print circuit (FPC). The first and second printed circuit board 41, 42 are disposed with a plurality of electronic elements, such as resistors, capacitors or chips.

The top cover 61 defines a plurality of positioning posts 611 around an inner wall thereof, and the bottom cover 62 defines a plurality of positioning holes 621 cooperating with corresponding positioning posts 611. The top cover 61 and the bottom cover 62 have the same shape with each other, each of the top cover 61 and the bottom cover 62 has a locking portion 623 on a back end thereof, and each locking portion 623 defines a slot 624 along a transverse direction, an arc-shaped cutout 625 is recessed downwards from an upper surface of the locking portion 623 to receive the cable 5.

Referring to FIGS. 1-3, a metallic shielding 3 is enclosing the insulative housing 1, and the cable 5 defines a strain relief portion 51 on a front segment thereof and a plurality of wires (not shown), and a rectangular retaining portion 510 is defined on the strain relief portion 51.

When assembling, the contacts 2 are received in the insulative housing 1, and the shielding 3 is enclosing the insulative housing 1. The tail portions 21 of the contacts 2 are soldered to the second printed circuit board 42, the first printed circuit board 41 is located above the second printed circuit board 42. One end of the flexible circuit 43 is soldered to the first printed circuit board 41, and the other end of the flexible circuit 43 is soldered to the second printed circuit board 42, thus the first printed circuit board 41 can electrically connect with the second printed circuit board 42 by the flexible circuit 43. The cable 5 is soldered to the second printed circuit board 42 with a front end thereof, and the retaining portion 510 is arranged in the slot 624 of the bottom cover 62, the top cover 61 is assembled to the bottom cover 62 from up to down, the positioning posts 611 of the top cover 61 are inserted into the corresponding positioning holes 621, and the locking portions 623 of the top cover 61 and the bottom cover 62 are cooperated with each other to hold the cable 5. Thus, the cable connector assembly 100 is assembled.

Figure 5:
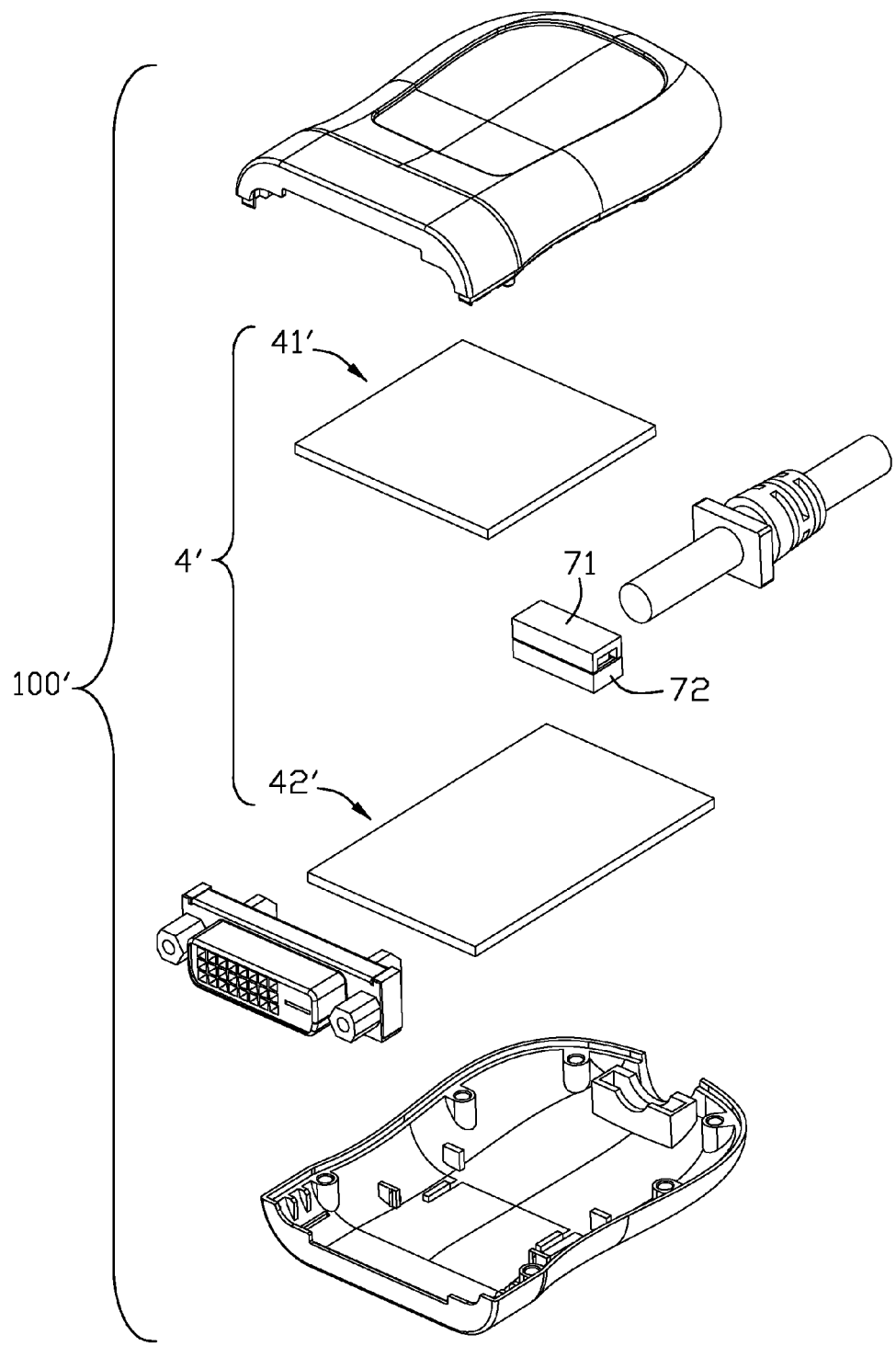
FIG. 5 is an exploded, perspective view of the cable connector assembly in accordance with the second embodiment of the present invention.

Additionally, referring to FIG. 5, a cable connector assembly 100' in accordance with the second embodiment of the present invention has most elements and same structures of the cable connector assembly 100 in accordance of the first embodiment. Compared with the cable connector assembly 100, the constitution of the printed circuit board 4' of the cable connector assembly 100' is different. The printed circuit board 4' includes a first printed circuit board 41' and a second printed circuit board 42', a first connector 71 is mounted and soldered on a lower surface of the first printed circuit board 41', and a second connector 72 is mounted and soldered on an upper surface of the second printed circuit board 42', the first connector 71 is mating with the second connector 72 to realize the electrical connection between the first printed circuit board 41' with the second printed circuit board 42'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cable connector assembly, comprising:
    an insulative housing having a plurality of contacts received therein;
    a shielding enclosing the insulative housing;
    a printed circuit board assembly connected with tail portions of the contacts, and having a first printed circuit board and a second printed circuit board located below the first printed circuit board, the first and the second printed circuit boards electrically connected with each other by a flexible circuit; and
    a cable connected with the printed circuit board assembly.

2. The cable connector assembly as claimed in claim 1, wherein one end of the flexible circuit is soldered to the first printed circuit board, and the other end of the flexible circuit is soldered to the second printed circuit board.

3. The cable connector assembly as claimed in claim 2, wherein the cable is soldered to the second printed circuit board with a front end thereof.

4. The cable connector assembly as claimed in claim 3, wherein the tail portions of the contacts are bent downwards and soldered to the second printed circuit board.

5. The cable connector assembly as claimed in claim 2, further comprising a cover, and wherein the cover includes a top cover and a bottom cover assembled to each other, each of the top cover and the bottom cover has a locking portion.

6. The cable connector assembly as claimed in claim 5, wherein each locking portion defines a slot along a transverse direction.

7. The cable connector assembly as claimed in claim 6, wherein a strain relief portion is defined on a front part of the cable and has a rectangular retaining portion, the retaining portion is received in the locking portion.

8. The cable connector assembly as claimed in claim 1, wherein the flexible circuit is a flexible flat cable.

9. The cable connector assembly as claimed in claim 1, wherein the flexible circuit is a flexible print circuit.

10. A cable connector assembly, comprising:
    an insulative housing having a plurality of contacts received therein;
    a shielding enclosing the insulative housing;
    a printed circuit board assembly connected with tail portions of the contacts, and having a first printed circuit board assembly and a second printed circuit board located below the first printed circuit board, the first and the second printed circuit boards electrically connected with each other by a pair of connectors mating with each other, one of the connectors arranged on a lower surface of the first printed circuit board, and another connector arranged on an upper surface of the second printed circuit board; and
    a cable connected with the printed circuit board.

11. The cable connector assembly as claimed in claim 10, wherein the cable is soldered to the second printed circuit board with a front end thereof.

12. The cable connector assembly as claimed in claim 11, wherein the tail portions of the contacts are bent downwards and soldered to the second printed circuit board.

13. The cable connector assembly as claimed in claim 12, further comprising a cover, and wherein the cover includes a top cover and a bottom cover assembled to each other, each of the top cover and the bottom cover has a locking portion.

14. The cable connector assembly as claimed in claim 13, wherein each locking portion defines a slot along a transverse direction.

15. The cable connector assembly as claimed in claim 14, wherein a strain relief portion is defined on a front part of the cable and has a rectangular retaining portion, the retaining portion is received in the locking portion.

16. A cable connector assembly comprising:
    an upper cover and a lower cover assembled to each other and commonly defining an internal space;
    an electrical front connector located at a front end of the internal space to forwardly communicate with an exterior;
    an upper printed circuit board and a lower printed circuit board spaced from each other in a parallel relation while commonly received in said internal space under condition that the upper printed circuit board is located closer to said upper cover than the lower printed circuit board, and the lower printed circuit board is located closer to said lower cover than the upper printed circuit board;
    said front connector being mechanically and electrically connected to one of said upper printed circuit board and said lower printed circuit board; and
    at least one cable being mechanically and electrically connected to one of said upper printed circuit board and said lower printed circuit board; wherein
    said upper printed circuit board and said lower printed circuit board are electrically connected to each other via a connection device located therebetween and respectively connected to said upper printed circuit board and said lower printed circuit board.

17. The cable connector assembly as claimed in claim 16, wherein said connection device is a flexible printed circuit (FPC).

18. The cable connector assembly as claimed in claim 16, wherein said connection device includes upper and lower connectors respectively mechanically and electrically connected to the upper printed circuit board and said lower printed circuit board.

19. The cable connector assembly as claimed in claim 16, wherein said one of the upper printed circuit board and the lower printed circuit board, to which the front connector is electrically and mechanically connected, is different from said one of the upper printed circuit board and said lower printed circuit board, to which the cable is electrically and mechanically connected.

* * * * *